United States Patent [19]

Oldham

[11] 4,396,996
[45] Aug. 2, 1983

[54] MONOLITHIC STATIC MEMORY CELL AND METHOD FOR ITS OPERATION

[75] Inventor: William G. Oldham, El Cerreto, Calif.

[73] Assignee: Siemens Aktiengesellschaft, Berlin & Munich, Fed. Rep. of Germany

[21] Appl. No.: 294,301

[22] Filed: Aug. 19, 1981

[30] Foreign Application Priority Data

Aug. 27, 1980 [DE] Fed. Rep. of Germany ....... 3032333

[51] Int. Cl.³ ........................ G11C 11/34; G11C 17/00
[52] U.S. Cl. ...................................... 365/95; 365/104; 365/114; 365/118; 365/184
[58] Field of Search ................... 365/94, 95, 104, 105, 365/114, 115, 118, 178, 184

[56] References Cited

U.S. PATENT DOCUMENTS

| 3,493,786 | 2/1970 | Ahrons et al. | 365/95 |
| 3,626,387 | 12/1971 | Terman | 365/118 |
| 4,070,655 | 1/1978 | Schurmeyer et al. | 365/184 |
| 4,333,164 | 1/1982 | Orikabe et al. | 365/178 |

FOREIGN PATENT DOCUMENTS 54-146935 11/1979 Japan ...................................... 365/95

OTHER PUBLICATIONS

IBM Technical Disclosure Bulletin, vol. 17, No. 12, May 1975, pp. 3634-3635, Monolithic Storage Cell Having Inherent Latent Image Memory Operation, P. S. Balasubramanian et al.
IBM Technical Disclosure Bulletin, vol. 17, No. 11, Apr. 1975, p. 3279, Programmable Memory Circuits, I. T. Ho et al.
IBM Technical Disclosure Bulletin, vol. 11, No. 4, Sep. 1968, p. 396, Flip-Flop Using Electron Beam Activated Fet's, G. Cheroff et al.
"Daten-Speicher", 1973, pp. 146-150, H. Kaufmann, R. Oldenbourg Publishing Co., Munich.
"Philips Techn. Rundschau" 35, 1975/1976, Nr. 3, pp. 72-84, Elektronenstrahlempfindliche Lacke fur die Herstelling Von Integrierten Schaltungen, E. D. Roberts.
"A Users Handbook of Semiconductor Memories", 1977, pp. 242-245, 248 and 249, E. R. Hnafek, John Wiley & Sons Publishing Co., New York.
"Siemens Forschungs-u. Entwicklungsbericht", vol. 4, 1975, Nr. 6, pp. 345-351, Erasable and Electrically Reprogrammable Read-Only Memory Using the N-Channel Simos One-Transistor Cell, B. Rossler et al.

Primary Examiner—George G. Stellar
Attorney, Agent, or Firm—Hill, Van Santen, Steadman, Chiara & Simpson

[57] ABSTRACT

A monolithic static memory cell has two cross-coupled inverters each comprised of a series connection of a field effect switching transistor and a load element designed as a field effect transistor. The field effect transistors forming the load elements have their channel resistances of different values. A gate insulating layer of one of the load element field effect transistors has its charge state altered, preferably by electron beam writing, so that a change in a threshold voltage of the one transistor results in a change of its channel resistance relative to the channel resistance of the other load element transistor if it was under before the selective altering, or vice-versa.

10 Claims, 5 Drawing Figures

MONOLITHIC STATIC MEMORY CELL AND METHOD FOR ITS OPERATION

BACKGROUND OF THE INVENTION

The invention relates to a monolithic static memory cell having two cross-coupled inverters each of which are comprised of a series connection of a field effect switching transistor and a load element designed as a field effect transistor connected to a supply voltage.

Such a memory cell, which is used in digital semiconductor memories with random access (RAM), is for example known in structure and manner of operation from the book "Data Memories" by H. Kaufmann, R. Oldenbourg Publishing Company, Munich 1973, pp. 146–150, incorporated herein by reference.

SUMMARY OF THE INVENTION

It is an object of the invention to design a memory cell of this kind in such a manner that on the one hand with connection of the supply voltage it flips into a predetermined position so that in this manner, a first digital information is continuously stored. On the other hand, this first digital information can be replaced by a second digital information as required.

According to the invention, in a monolithic static memory cell of the type described above, the load element field effect transistors have their channel resistances of different values. Means are provided for selectively altering a charge state of the gate insulating layer of one of the load element field effect transistors such that a change in a threshold voltage of the one transistor results in a change of its channel resistance over the channel resistance of the other load element transistor if it was under before the selective altering or vice-versa.

An advantage attainable with the invention is that transcribing from the first digital information continuously stored in the memory cell to the second digital information occurs with the aid of an electron beam generated with a customary electron beam writer without a masking step being necessary. In addition, the transcribing or over-writing can be undertaken after the metallizations of the monolithically integrated circuit have been applied so that the manufacturing method steps preceding the method step with which the conducting coatings are applied and defined are not influenced by the transcribing processes.

DESCRIPTION OF THE PREFERRED EMBODIMENTS

Figure 1:
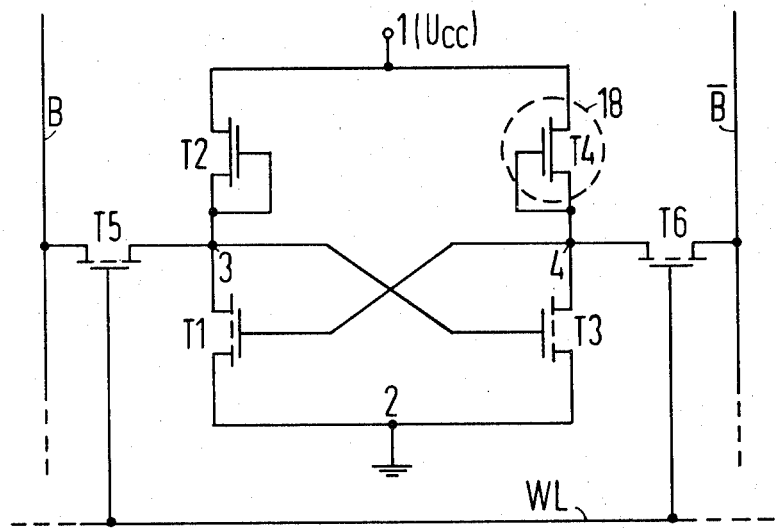
FIG. 1 illustrates a schematic diagram of a first embodiment of a memory cell designed according to the invention.

In FIG. 1, a static memory cell integrated monolithically on a semiconductor body is illustrated. The cell is constructed from two cross-coupled inverters. The first inverter has a field effect switching transistor T1 and a load element connected in series comprised of a field effect transistor T2 whose gate electrode is connected with its source terminal. The second inverter is formed in an analogous manner of a field effect switching transistor T3 and a field effect transistor T4. T1 and t3 are transistors of the enhancement type while T2 and T4 are transistors of the depletion type. The drain terminals of T2 and T4 are connected via a terminal lead 1 with a supply voltage $V_{cc}$, while the source terminals of T1 and T3 are connected with a terminal lead 2 lying at reference voltage. Node 3, which represents the output of the inverter T1, T2, is connected with the input of the inverter T3, T4. Node 4, that is the output of the inverter T3, T4, is connected to the input of the inverter T1, T2. For selection of the memory cell, a word line WL is connected with the gate electrodes of two selection transistors T5 and T6. A bit line B is connected via the source-drain path of T5 with node 3, while a second bit line $\overline{B}$ is in connection with node 4 via the source-drain path of T6.

With writing-in of a logic "1" or "0", in each case the bit line B or $\overline{B}$ is placed at reference potential such that the circuit branch with transistors T3, T4 or the one with transistors T1, T2 is blocked via the associated field effect switching transistor while the other circuit branch in each case has current flowing through it because of the conducting state of the field effect switching transistor contained in it. In the blocked state of the circuit branch with T1, T2, node 3 lies approximately at the supply voltage $U_{cc}$, while node 4 lies approximately at reference potential. If on the other hand circuit branch T3, T4 is blocked, then the voltage relationships at nodes 3 and 4 reverse. When reading out the stored information, then bit lines B and $\overline{B}$ are connected via the source-drain paths of T5 and T6 to the information-dependent potentials of the nodes 3 and 4, whereby, depending upon information to be read out, the one or the other bit line becomes current-carrying.

In order to insure that the memory cell (in connection with supply voltage $U_{cc}$) flips into a predetermined position corresponding to a continuously stored digital information, the field effect transistors T2 and T4 are designed with different channel resistances. For this purpose, dimensions of their source-drain channels are embodied differently. If, for example, the transistor T2 has a channel width W which, with respect to its channel length L, is in a ratio of 20:4, while the quotient of channel width to channel length in the case of transistor T4, for example, is 15:4, then the channel resistance of T2, because of the larger channel width, is lower than that of T4. Accordingly, the memory cell with connection of $U_{cc}$ will constantly flip into the position in which node 3 lies approximately at the potential of the terminal lead 1 and node 4 lies approximately at the potential of terminal lead 2. The information stored in this manner can be used for test or checking purposes.

Independently of the information present with connection of the supply voltage $U_{cc}$, any random digital information can be electrically written into the memory cell in the operation in the manner described above or again be read out of it.

Figure 2:
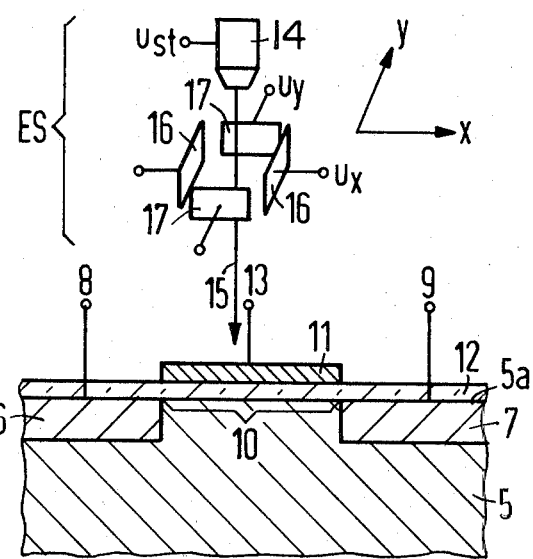
FIG. 2 shows a cross-section view of a portion of the circuit of FIG. 1.

The field effect transistor T4 is depicted in FIG. 2 in cross-section. It is integrated into a semiconductor body 5 comprising silicon, for example; and in case of a p-doping of the same, it is designed as a N-channel MIS structure of the enhancement type. By MIS structure, in general a structure is understood which encompasses a semiconductor body and a metal layer separated from this by means of an electrically insulating layer. T4 has n+-doped source and drain regions designated in FIG. 2 at 6 and 7 which are placed in the semiconductor body 5. These regions extend to the interface 5a of the semiconductor body 5 and are provided with terminals 8 and 9. Between regions 6 and 7 at the interface 5a there is located channel region 10 which is covered over by a metallically conducting gate electrode 11 separated from the interface 5a by means of a gate insulating layer 12, for example of $SiO_2$. The gate electrode 11 has a terminal 13.

In FIG. 2, an electron beam writer ES is further indicated which is provided with an electron gun 14. An electron beam 15 exiting therefrom is deflected in directions x and y by means of two deflection systems with pairs of plates 16 and 17 which in each case are connected with voltages $u_x$ and $u_y$. Now, the sharply focused electron beam 15, in dependence upon the voltages $u_x$ and $u_y$, scans over the surface of the semiconductor body 5, for example in individual lines running parallel to one another. An electron beam writer of this sort, but which is equipped with magnetic deflection systems in place of electrostatic deflection systems 16 and 17, can be used as described in the magazine Philips Technical Survey 35, 1975/76, No. 3, pp. 72–84, in particular, page 73, FIG. 1, incorporated herein by reference.

The electron beam 15 in each case is only connected by means of a supplied control voltage $u_{st}$ when it is just scanning over the channel region 10. In the case of a current density of electron beam 15 of, for example, 1 $A/cm^2$, an acceleration voltage of approximately 25 keV, and a local influence duration of approximately $10^{-6}$s, in the gate insulating layer 12 charge carrier pairs form. In each case the negative charge carriers flow off into the semiconductor body connected with a reference potential while the positive charge carriers remain in the gate insulating layer 12 and charge this positively. A charging of approximately the same size however results also for a current density of 100 $A/cm^2$ and an influence duration of $10^{-8}$s with acceleration voltage remaining the same. Accordingly, it is apparent that the size of the positive charge essentially depends upon the product of current density and influence duration. The values specified are, however, only examples and can be varied within the framework of the invention depending upon the size of the desired positive charge.

By means of positive charging of the gate insulating layer 12, the cutoff or threshold voltage $U_t$ of the N-channel transistor T4 moves to a lower value. However, this signifies that the channel resistance of T4 is reduced. If this occurs to such a degree that the channel resistance of T4 becomes smaller than the channel resistance of T2, then with connection of $U_{cc}$, the memory cell will no longer flip into the geometrically channel designed preferred position, but rather in the opposite one.

By means of irradiation of T4 with the electron beam 15 in the described manner indicated in FIG. 1, as indicated by the broken circle 18 on the basis of the geometric dimensions of the channel regions of T2 and T4, one succeeds in overwriting continuously stored information by means of another information such that, after connection, the other preferred position in each case is assumed. This information can, for example, be test or check information associated with an individual user, and which deviates from the geometrically implemented check or test information first used by the manufacturer. In this manner, in the case of a plurality of memory cells arranged in lines and columns, both test or check data given by the manufacturer can be continuously stored. Also, in a simple manner, changes can be undertaken in these test or check data based upon desires of the user.

A selective displacement of the cutoff voltage of T4 can also proceed in the following manner. First the cutoff voltages of both field effect transistors T2 and T4 or, respectively, all field effect transistors T1 through T4 are moved in each case to a lower value by means of a common irradiation with X-rays or with the electron beam of an electron beam writer whose current density, influence duration and acceleration voltage are selected in the described manner. Thereafter, an additional selective irradiation of the channel regions of the transistors T1 through T3 or, respectively of the transistor T2, whose cutoff voltages should not be changed, takes place with an electron beam 15 of very large power density. This power density is selected such that the gate insulating layer 12 of the last-named transistors in each case heats up to a temperature of approximately 500° to 600° C. and the stored positive charge carriers flow off into the semiconductor body 5. Consequently the gate insulating layer is again discharged and attains the original value of the cutoff voltage. Here, a current density of 100 to 500 $A/cm^2$ and a local influence duration of $10^{-4}$s are utilized with an acceleration voltage of 25 keV.

Figure 3:
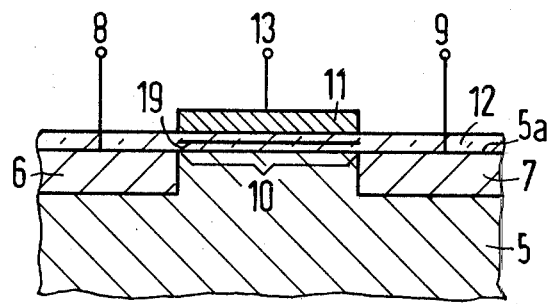
FIG. 3 shows in cross-section a first alternative embodiment of the circuit portion of FIG. 2.
Figure 4:
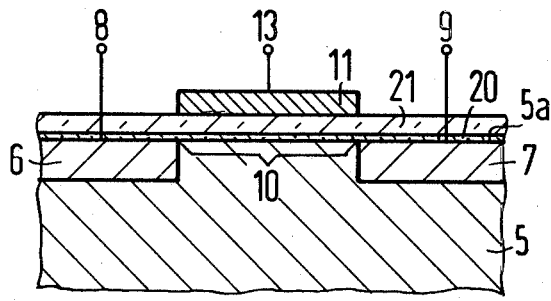
FIG. 4 shows in cross-section a second alternative embodiment of the circuit portion of FIG. 2.

Advantageous further developments of the transistor T4 are depicted in FIGS. 3 and 4. In FIG. 3, a polysilicon layer 19 connected free of external potentials, and thus in a "floating" state, is introduced into the gate insulating layer 12. According to FIG. 4, the gate insulating layer of T4 is comprised of two different partial layers, for example of a $SiO_2$ layer 20 and a $Si_3N_4$ layer 21 lying thereover. In the case of these embodiments of transistor T4, the charge states of the gate insulating layer are stabilized by means of the conducting layer 19 or by the interface between the partial layers 20 and 21. In a practical manner, also transistor T2 is further developed according to FIG. 2 or 3.

Another possibility of transcribing of the memory cells T1 through T4 from a geometrically conditioned preferred position with connection of the supply voltage into the opposing preferred position is that the cutoff or threshold voltage of the N-channel transistor T2 which has a smaller channel resistance is displaced in the direction of larger values by means of negative charging of its gate insulating layer. The amount of this displacement is thereby selected such that the channel resistance of T2 resulting becomes larger than the channel resistance of T4. For this purpose, in an advantageous manner a transistor T2 further developed according to the FIGS. 3 or 4 is used whose polysilicon layer 19 or whose interface between partial layers 20 and 21 is negatively charged in the customary manner. Such negative charging is, for example, described in "A Users Handbook of Semiconductor Memories" by E. R. Hnafek, John Wiley & Sons Publishing Company, New York, 1977, pp. 242–245 and 248, 249 or in the Siemens Research and Development Reports, Vol. 4 (1975), No. 6, pp. 345–351, incorporated herein by reference. In many cases it will be practical to first negatively charge the gate insulating layers of both transistors T2 and T4 in this manner and, thereafter, to undertake a selective irradiation of the channel region 10 of the transistor T4 with the electron beam 15 whose current density, influence duration, and acceleration voltage are selected in the manner already described so that the gate insulating layer of T4 heats up to a temperature allowing it to discharge. Accordingly, T4 again assumes its original cutoff or threshold voltage while the displacement of the cutoff or threshold voltage of T2 remains at a larger value.

Figure 5:
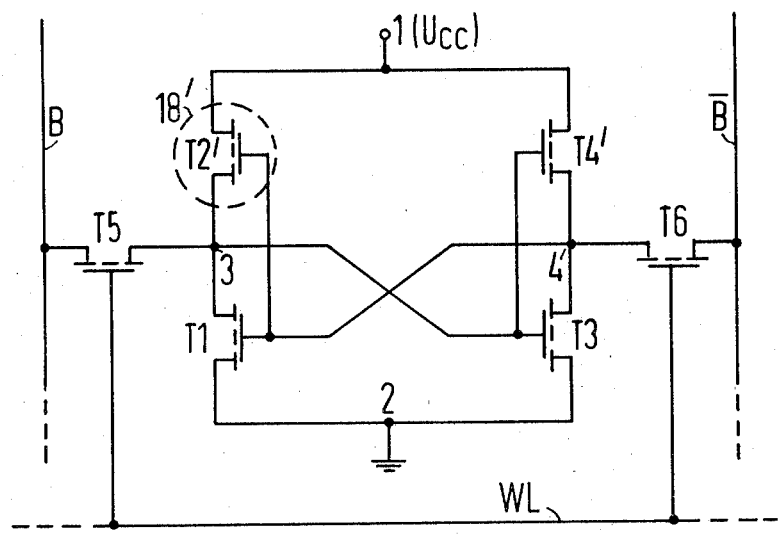
FIG. 5 shows a schematic diagram of a second embodiment of the memory cell according to the invention.

FIG. 5 shows a memory cell embodied in complementary channel technology according to the invention. Here, T1 and T3 are designed as N-channel transistors of the enhancement type while T2' and T4' are P-channel transistors of the enhancement type. The gate electrodes of T1 and T2' as well as of T3 and T4' are connected with one another. The remaining circuit portions correspond to the circuit portions designated the same from FIG. 1. In FIG. 5, for the case when T2' has a larger channel width than T4', with the connection of $U_{cc}$ again a preferred position is assumed whereby node 3 lies approximately at the potential of the terminal lead 1 and node 4 lies approximately at the potential of terminal lead 2. If one irradiates the channel region of T2' or portions of it with an electron beam 15 for the purpose of a positive charging of the gate insulating layer indicated in FIG. 5 by means of the broken line circle 18', then by designing a channel resistance of T2' larger than that of T4', a reversal of the preferred position is attained with the connection of $U_{cc}$. A negative charge which accomplishes the same thing must here be undertaken on transistor T4'.

The last discussed charging procedures also come into consideration when all transistors T1 through T4 are designed as P-channel transistors and are integrated into a n-doped semiconductor body 5.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A monolithic static memory cell, comprising: two cross-coupled inverters each comprised of a series connection of a field effect switching transistor and a load element designed as a field effect transistor with a gate insulating layer and which is connected to a supply voltage; the field effect transistors forming the load elements having channel resistances of different values; and means for selectively altering charge state of said gate insulating layer of one of the load element field effect transistors such that a change in a threshold voltage of the one transistor results in a change of its channel resistance over the channel resistance of the other load element transistor if it was under before the selective altering, or vice-versa.

2. A cell according to claim 1 wherein the means for selectively altering comprises electron beam induced or written charge carriers in the insulating layer.

3. A monolithic static memory cell according to claim 1 wherein the field effect transistors forming the load elements have different quotients of channel width to channel length.

4. A monolithic static memory cell according to claim 1 wherein said means for selectively altering comprises a conducting layer inserted into the gate insulating layer.

5. A monolithic cell according to claim 1 wherein said means for selectively altering comprises impurities inserted into the gate insulating layer.

6. A monolithic static memory cell according to claim 1 wherein at least one of the field effect transistors which form the load elements is designed as a transistor whose gate-insulating layer comprises a $SiO_2$ layer and an adjacent $Si_3N_4$ layer.

7. A method for the operation of a monolithic static memory, comprising the steps of:
    providing two cross-coupled inverters each comprised of a series connection of a field effect switching transistor and a load element designed as a field effect transistor, the load element field effect transistors having differing channel resistances;
    selectively altering when operationally desired a charge state of a gate insulating layer of one of the load element field effect transistors such that a change in a threshold voltage of the one transistor results in a change of its channel resistance over the channel resistance of the other load element transistor if it was under before the selective altering or vice-versa;
    said selective altering including the steps of deflecting an electron beam of an electron beam writer such that it selectively scans the channel region of the field effect transistor, a current density, influence duration, and acceleration voltage of the electron beam being selected such that the beam generates in the gate insulating layer a positive charge which moves the value of the threshold voltage from a lower value existing without this charging to a higher value or vice-versa.

8. A method according to claim 7 including the further steps of commonly displacing threshold voltages of both field effect transistors forming the load elements by irradiation, both field effect transistor gates being positively charged, and following this, selectively irradiating a channel region of one of the two load element field effect transistors with an electron beam whose current density, influence duration, and acceleration voltage are selected such that the gate insulating layer of this field effect transistor heats to a temperature whereby it is again discharged so that its threshold voltage again assumes its original value.

9. A method for the operation of a monolithic static memory cell according to claim 7 including the further steps of first negatively charging gate insulating layers of both field effect transistors which form the load elements such that these field effect transistors experience a common shift of their threshold voltages and, following this, selectively irradiating a channel region of one of these field effect transistors with an electron beam of an electron beam writer whose current density, influence duration, and acceleration voltage are selected such that the gate insulating layer of the one field effect transistor heats to a temperature such that it is again discharged and has a threshold voltage which corresponds to the original value.

10. A method for the operation of a monolithic static memory, comprising the steps of:
    providing two cross-coupled inverters each comprised of a series connection of a field effect switching transistor and a load element designed as a field effect transistor;
    providing differing channel resistances for the load element field effect transistors such that when the cell is energized, it switches to a first state automatically; and selectively altering when operationally desired a charge state of the gate insulating layer of one of the load element field effect transistors such that a change in a threshold voltage of the one transistor results in a change of its channel resistance over the channel resistance of the other load element transistor if it was under before the selective altering or vice-versa such that the memory cell will assume a second state rather than the first state.

* * * * *